United States Patent
Natali et al.

(10) Patent No.: US 10,043,871 B1
(45) Date of Patent: Aug. 7, 2018

(54) RARE EARTH NITRIDE AND GROUP III-NITRIDE STRUCTURE OR DEVICE

(71) Applicants: Franck Natali, Porirua (NZ); Stéphane Ange Vézian, Grasse (FR)

(72) Inventors: Franck Natali, Porirua (NZ); Stéphane Ange Vézian, Grasse (FR)

(73) Assignee: ECOLE POLYTECHNIQUE FEDERALE DE LAUSANNE (EPFL), Lausanne (CH)

(*) Notice: Subject to any disclaimer, the term of this patent is extended or adjusted under 35 U.S.C. 154(b) by 0 days.

(21) Appl. No.: 15/480,406

(22) Filed: Apr. 6, 2017

(51) Int. Cl.
*H01L 29/15* (2006.01)
*H01L 29/267* (2006.01)
*H01L 29/20* (2006.01)
*H01L 29/04* (2006.01)
*H01L 29/24* (2006.01)
*H01L 21/02* (2006.01)

(52) U.S. Cl.
CPC ........ *H01L 29/267* (2013.01); *H01L 21/0254* (2013.01); *H01L 21/02458* (2013.01); *H01L 21/02609* (2013.01); *H01L 29/045* (2013.01); *H01L 29/2003* (2013.01); *H01L 29/24* (2013.01)

(58) Field of Classification Search
CPC ........... H01L 21/02458; H01L 21/0254; H01L 21/02609; H01L 21/045; H01L 29/2003; H01L 29/045; H01L 29/267
See application file for complete search history.

(56) References Cited

U.S. PATENT DOCUMENTS 6,054,331 A * 4/2000 Woo ............... C23C 14/165
                                                    438/3
2015/0048306 A1* 2/2015 Myers ............. H01L 33/06
                                                    257/13

FOREIGN PATENT DOCUMENTS

WO    WO 2015152737 A2 * 10/2015 ............. C30B 29/38

OTHER PUBLICATIONS

Chan, J. R., Vézian, S., Trodahl, J., Khalfioui, M. A., Damilano, B., & Natali, F. (2016). Temperature-Induced Four-Fold-on-Six-Fold Symmetric Heteroepitaxy, Rocksalt SmN on Hexagonal AlN. Crystal Growth & Design, 16(11), 6454-6460.

(Continued)

*Primary Examiner* — Yosef Gebreyesus
(74) *Attorney, Agent, or Firm* — Andre Roland S.A.; Nikolaus Schibli

(57) ABSTRACT

Structure or device comprises a $Al_xGa_{1-x}N$ or $In_yGa_{1-y}N$ layer or substrate, a rare earth nitride epitaxial layer, and an $Al_zGa_{1-z}N$ epitaxial interlayer between the rare earth nitride epitaxial layer and the $Al_xGa_{1-x}N$ or $In_yGa_{1-y}N$ layer or substrate. The interlayer is in direct contact with the rare earth nitride epitaxial layer and the $Al_xGa_{1-x}N$ or $In_yGa_{1-y}N$ layer or substrate.

19 Claims, 12 Drawing Sheets

(56) References Cited

OTHER PUBLICATIONS

Grundmann, M. (2011). Formation of epitaxial domains: Unified theory and survey of experimental results. physica status solidi (b), 248(4), 805-824.

Le Louarn, A., Vézian, S., Semond, F., & Massies, J. (2009). AlN buffer layer growth for GaN epitaxy on (111) Si: Al or N first?. Journal of Crystal Growth, 311(12), 3278-3284.

Vézian, S., Damilano, B., Natali, F., Al Khalfioui, M., & Massies, J. (2016). AlN interlayer to improve the epitaxial growth of SmN on GaN (0001). Journal of Crystal Growth, 450, 22-27.

* cited by examiner

RARE EARTH NITRIDE AND GROUP III-NITRIDE STRUCTURE OR DEVICE

FIELD OF THE INVENTION

The present invention relates to structures or devices comprising both rare earth nitrides (RENs) and group III-nitrides, and a method for producing such structures or devices.

DISCUSSION OF THE BACKGROUND ART

Rare earth (RE) elements are a set of fifteen chemical elements in the periodic table, consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). While named rare earths, they are in fact not that rare and are relatively abundant in the Earth's crust with the exception of promethium, which has no stable nuclear isotope.

The rare earth nitrides (RENs) form in the face-centered cubic (FCC) rocksalt NaCl structure with lattice constants ranging from ~5.3 Å for LaN to ~4.76 Å for LuN, in total a 5% difference across the series and less than 0.5% between nitrides of neighbouring atomic species. There is clearly potential for epitaxial growth of custom-designed heterostructures, including superlattices, and even for controlled strains to be introduced.

Most of the fifteen RENs are intrinsic ferromagnetic semiconductors with magnetic properties that provide interesting contrasts and promising complementary electronic properties that make them genuinely attractive for spintronic applications. The RENs exhibit a wide variety of hard- and soft-ferromagnetic properties, i.e. the series includes members with small and huge coercive fields. The best example is GdN and SmN; GdN has a coercive field as small as ~0.01 Tesla, while in contrast SmN has a coercive field in excess of 6 Tesla.

The recent demonstration that this new class of ferromagnetic materials is epitaxy-compatible with group III-nitrides (GaN, AlN and InN), which are a technologically important nonmagnetic semiconductor family for the fabrication of white and blue light emitting diodes and transistors, has raised interest not only for semiconductor-based spintronics but also for the possibility of enhancing the efficiency of GaN-based light emitting diodes.

Group III-nitrides crystallize in either the cubic zinc blende or hexagonal wurtzite structure. Under ambient conditions, the thermodynamically stable structure is the hexagonal wurtzite structure, and commercially available devices such as blue and white LEDs have also a hexagonal wurtzite structure. The wurtzite crystal structure is a member of the hexagonal crystal system or family. Its space group is P63mc in Hermann-Mauguin notation or No. 186 (in the International Union of Crystallography classification).

Success in obtaining REN thin films epitaxially grown on wurtzite (0001) oriented group III-nitride surfaces has been central in obtaining a better understanding of their fundamental properties, in particular demonstrating, for most of them, their intrinsic ferromagnetic semiconducting nature with a wide variety of magnetic properties across the series. GdN and SmN thin films, typically of the order of tens of nanometers in thickness, have been the most studied compounds of the REN series, with several articles published relating to the effect of the growth parameters (growth temperature, RE-nitrogen flux ratio . . . ) on the structural and electronic properties.

Developing heterojunction device structures based on these two nitride families will rely on the understanding and the ability to control, at the atomic scale, the interface structure and chemical stability. Hitherto these aspects have not been studied in depth.

The present disclosure concerns the very first stages of the epitaxial growth of a REN on a group III-nitride material surface, for example GaN, (Al,Ga)N, InN or (In,Ga)N. During such growth, a group III element, (for example gallium) can segregate at the surface during growth of the REN on the group III-nitride surface producing a diluted and complex REN-group III-nitride interface. The absence of a sharp REN-group III-nitride interface deteriorates the structural quality of the REN layer grown on group III-nitride surface. Segregation is equally expected to for epitaxial, polycrystalline and amorphous layers.

SUMMARY

It is therefore one aspect of the present disclosure to provide a rare earth nitride and group III-nitride structure or device that overcomes the above challenge. The structure or device comprises an $Al_xGa_{1-x}N$ or $In_yGa_{1-y}N$ layer or substrate where $0 \leq x < 0.7$ and $0 < y \leq 1$, at least one rare earth nitride layer, and an $Al_zGa_{1-z}N$ interlayer between the at least one rare earth nitride layer and the $Al_xGa_{1-x}N$ or $In_yGa_{1-y}N$ layer or substrate where $1 \geq z \geq 0.8$. The $Al_zGa_{1-z}N$ interlayer is in direct contact with the at least one rare earth nitride layer and the $Al_xGa_{1-x}N$ or $In_yGa_{1-y}N$ layer or substrate.

The presence of an $Al_zGa_{1-z}N$ interlayer where $1 \geq z \geq 0.8$ permits the above problem to be addressed and a sharp REN-group III-nitride interface to be obtained as well as a higher structural quality of the REN layer grown on group III-nitride surface.

According to another aspect of the present disclosure, the $Al_xGa_{1-x}N$ or $In_yGa_{1-y}N$ layer is a hexagonal crystal layer or the $Al_xGa_{1-x}N$ or $In_yGa_{1-y}N$ substrate is a hexagonal crystal substrate, the at least one rare earth nitride layer is a rare earth nitride epitaxial crystal layer and the $Al_zGa_{1-z}N$ interlayer is an $Al_zGa_{1-z}N$ epitaxial crystal layer.

According to still another aspect of the present disclosure, the hexagonal crystal layer or hexagonal crystal substrate has a hexagonal net with a six-fold symmetry.

According to yet another aspect of the present disclosure, the hexagonal crystal layer or hexagonal crystal substrate has a hexagonal wurtzite structure.

According to another aspect of the present disclosure, the rare earth nitride epitaxial layer is or comprises a fully (001) oriented epitaxial layer.

According to still another aspect of the present disclosure, the rare earth nitride epitaxial layer is or comprises a fully (111) oriented epitaxial layer.

According to another aspect of the present disclosure, the $Al_zGa_{1-z}N$ epitaxial interlayer consists of or comprises between two and twelve monolayers.

According to yet another aspect of the present disclosure, the structure or device includes a capping for passivating the rare earth nitride epitaxial layer.

According to still another aspect of the present disclosure, the rare earth nitride epitaxial layer includes or consists of at least one rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

According to another aspect of the present disclosure, the rare earth nitride epitaxial layer includes or consists of at least one rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

According to still another aspect of the present disclosure, the rare earth nitride epitaxial layer is doped with at least one element that is beryllium, magnesium, calcium, strontium, barium or radium.

According to yet another aspect of the present disclosure, the structure or device further includes at least one additional rare earth nitride epitaxial layer or multiple successive rare earth nitride epitaxial layers, the at least one additional rare earth nitride epitaxial layer or multiple successive rare earth nitride epitaxial layers comprising or consisting of a rare earth nitride and/or an alloy of rare earth nitrides.

According to another aspect of the present disclosure, the structure or device further includes at least one additional optical or electrical active layer or region located on the rare earth nitride epitaxial layer.

According to yet another aspect of the present disclosure, the at least one additional optical or electrical active layer or region located on the rare earth nitride epitaxial layer is a Group III-nitride layer or region.

According to still another aspect of the present disclosure, the hexagonal crystal layer is a (0001)-oriented layer or the hexagonal crystal substrate is a (0001)-oriented hexagonal substrate.

According to yet another aspect of the present disclosure, the $Al_xGa_{1-x}N$ or $In_yGa_{1-y}N$ crystal layer is located on a substrate of one of the following materials: GaN, AlN, InN, or any alloys thereof, or $Al_2O_3$, or ZnO, or $Zn_xMg_{1-x}O$ with x ranging from 1 to 0.4.

According to another aspect of the present disclosure, the rare earth nitride epitaxial layer is SmN.

According to another aspect of the present disclosure, the $Al_xGa_{1-x}N$ layer or substrate comprises or is GaN and the $Al_zGa_{1-z}N$ interlayer comprises or is AlN.

According to another aspect of the present disclosure, the $Al_xGa_{1-x}N$ or $In_yGa_{1-y}N$ layer is a polycrystalline layer or the $Al_xGa_{1-x}N$ or $In_yGa_{1-y}N$ substrate is a polycrystalline substrate, the at least one rare earth nitride layer is a polycrystalline rare earth nitride layer and the $Al_zGa_{1-z}N$ interlayer is a polycrystalline layer.

It is yet another aspect of the present disclosure to provide a method for producing a rare earth nitride and group III-nitride structure or device. The method preferably includes the steps of:

providing a $Al_xGa_{1-x}N$ or $In_yGa_{1-y}N$ layer or substrate where $0 \leq x < 0.7$ and $0 < y \leq 1$, providing a rare earth nitride layer, and providing an $Al_zGa_{1-z}N$ interlayer, where $1 \geq z \geq 0.8$, between the rare earth nitride layer and the $Al_xGa_{1-x}N$ or $In_yGa_{1-y}N$ layer or substrate, the interlayer being in direct contact with the rare earth nitride layer and the $Al_xGa_{1-x}N$ or $In_yGa_{1-y}N$ layer or substrate.

According to another aspect of the present disclosure,

The above and other objects, features and advantages of the present invention and the manner of realizing them will become more apparent, and the invention itself will best be understood from a study of the following description with reference to the attached drawings showing some preferred embodiments of the invention.

A BRIEF DESCRIPTION OF THE SEVERAL VIEWS OF THE DRAWINGS

FIG. 1A schematically shows an exemplary structure or device according to one aspect of the present disclosure;

FIG. 1B schematically shows an exemplary structure or device according to another aspect of the present disclosure;

FIG. 1C schematically shows an exemplary structure or device according to further aspect of the present disclosure;

FIG. 1D schematically shows an exemplary structure or device according to another aspect of the present disclosure;

FIG. 1E schematically shows an exemplary structure or device according to further aspect of the present disclosure;

FIG. 1F schematically shows an exemplary structure or device according to further aspect of the present disclosure;

Figure 6A:
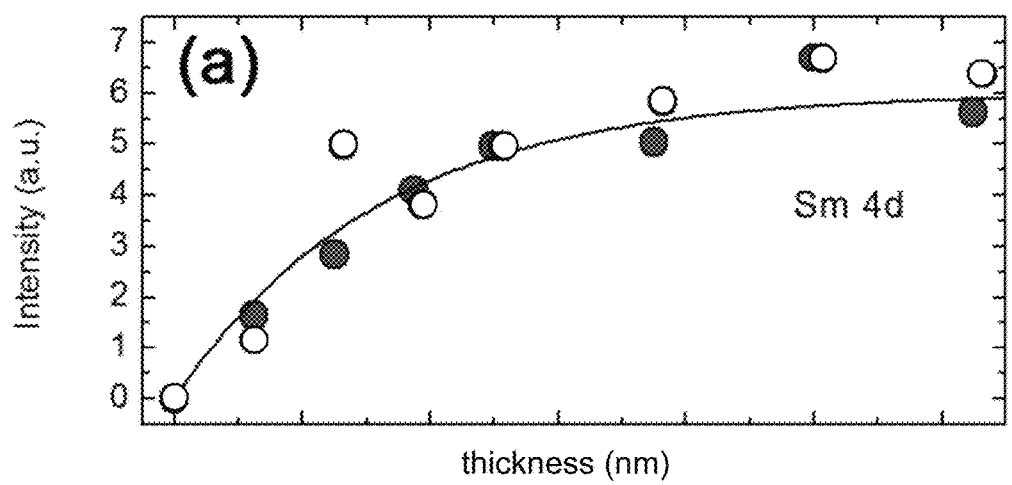

FIG. 6A presents integrated area under core level peaks versus SmN thickness for Sm 4d peak components, dark and white circles correspond to SmN grown directly on GaN and on a 8 ML thick AlN interlayer grown on GaN, respectively.

Figure 6B:
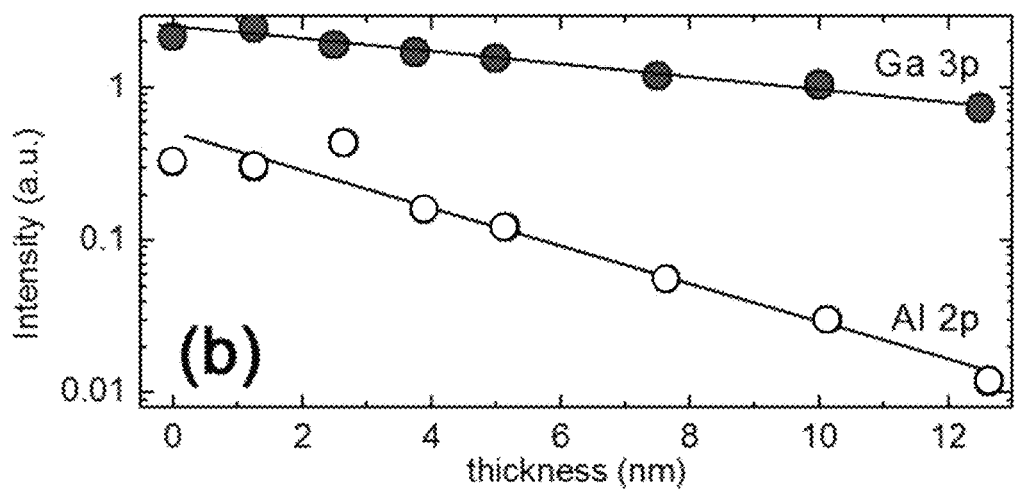

FIG. 6B presents integrated area under core level peaks versus SmN thickness for Ga 3p and Al 2p peak components; dark and white circles correspond to SmN grown directly on GaN and on a 8 ML thick AlN interlayer grown on GaN, respectively.

Figure 7:
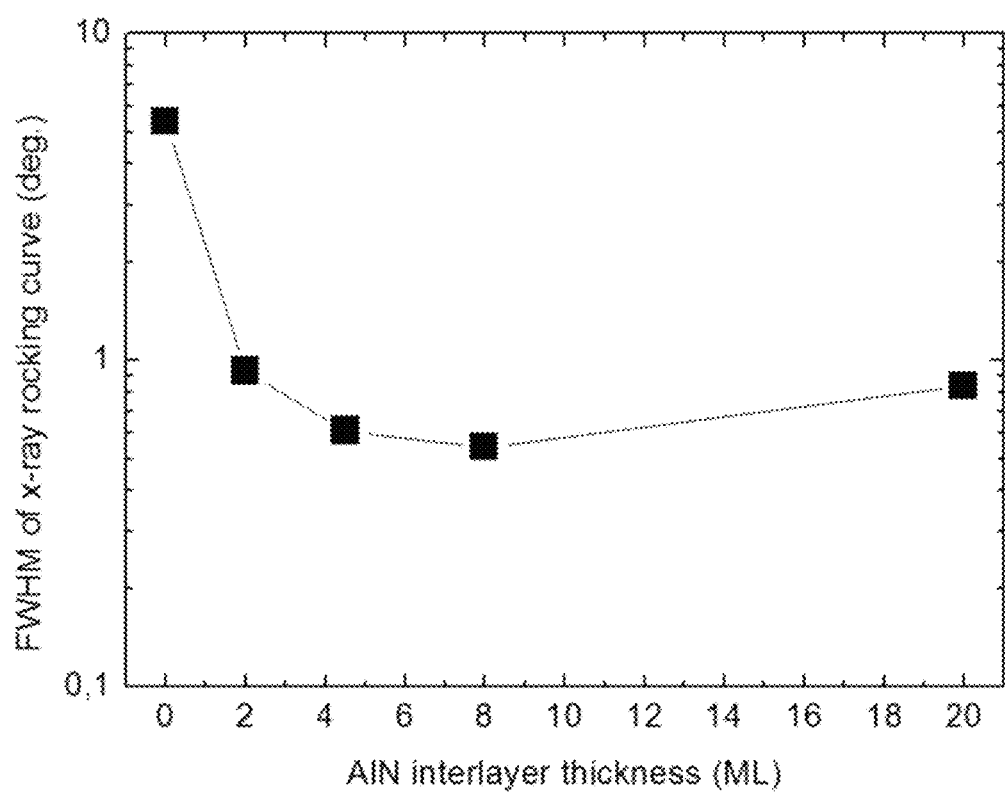

FIG. 7 shows a full width at half-maximum (FWHM) of the out of plane (111) rocking curve of 100 nm thick SmN layer as a function of the AlN interlayer thickness, where the AlN thickness is expressed in monolayers (ML), 1 ML=0.25 nm.

Herein, identical reference numerals are used, where possible, to designate identical elements that are common to the figures.

DETAILED DESCRIPTION OF SEVERAL EMBODIMENTS

Figure 1A:
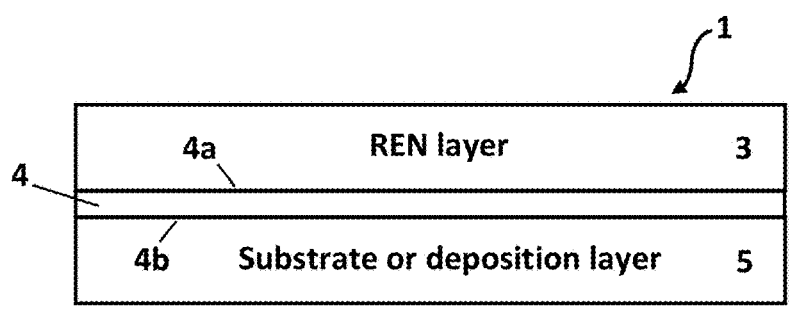

FIG. 1A schematically shows an exemplary structure or device 1 according to one embodiment. The structure or device 1 includes a rare earth nitride (REN) material layer 3, and an $Al_xGa_{1-x}N$ or $In_yGa_{1-y}N$ layer 5 or $Al_xGa_{1-x}N$ or $In_yGa_{1-y}N$ substrate 5 where for example 0≤x<0.7 and 0<y≤1. The structure or device 1 further includes an $Al_zGa_{1-z}N$ interlayer 4 where, for example, 1≥z≥0.8, the interlayer 4 being between the rare earth nitride layer 3 and the $Al_xGa_{1-x}N$ or $In_yGa_{1-y}N$ layer 5 or substrate 5. The interlayer 4 is in direct contact with the rare earth nitride layer 3 and the $Al_xGa_{1-x}N$ or $In_yGa_{1-y}N$ layer or substrate 5.

The $Al_xGa_{1-x}N$ layer or substrate 5 may comprise or be, for example, GaN (x=0) or $Al_xGa_{1-x}N$ where the Al content is in the range 0<x<0.7. The $In_yGa_{1-y}N$ layer or substrate 5 may comprise or be, for example, InN (y=1) or $In_yGa_{1-y}N$ where 0<y<1. The $Al_zGa_{1-z}N$ interlayer 4 may comprise or be, for example, AlN (z=1) or $Al_zGa_{1-z}N$ where 1>z≥0.8.

The structure or device 1 includes, for example, a rare earth nitride (REN) material epitaxial layer 3, and an $Al_xGa_{1-x}N$ or $In_yGa_{1-y}N$ hexagonal crystal layer 5 or $Al_xGa_{1-x}N$ or $In_yGa_{1-y}N$ hexagonal crystal substrate 5 as well as an $Al_zGa_{1-z}N$ epitaxial layer 4 between the rare earth nitride epitaxial layer 3 and the $Al_xGa_{1-x}N$ or $In_yGa_{1-y}N$ hexagonal crystal layer 5 or the $Al_xGa_{1-x}N$ or $In_yGa_{1-y}N$ hexagonal crystal substrate 5.

A first side or surface (upper surface) 4a of the epitaxial interlayer 4 is in direct contact with the rare earth nitride epitaxial layer 3 and a second side or surface (lower surface) 4b of the epitaxial interlayer 4 is in direct contact with the $Al_xGa_{1-x}N$ or $In_yGa_{1-y}N$ hexagonal crystal layer 5 or hexagonal crystal substrate 5.

The $Al_xGa_{1-x}N$ or $In_yGa_{1-y}N$ hexagonal crystal layer 5 or $Al_xGa_{1-x}N$ or $In_yGa_{1-y}N$ hexagonal crystal substrate 5 can have a hexagonal net with a six-fold symmetry, as described for example in the article M. Grundmann, Phys. Status Solidi B, 248, 382805-824 (2011), which is fully incorporated herein by reference. The hexagonal layer or hexagonal substrate 5 is part of the hexagonal crystal family.

The $Al_xGa_{1-x}N$ or $In_yGa_{1-y}N$ hexagonal crystal layer 5 or hexagonal crystal substrate 5 preferably has a hexagonal wurtzite structure. This hexagonal crystal layer 5 or hexagonal crystal substrate 5 is preferably (0001) oriented. (0001) represents the crystallographic orientation as defined by the Bravais-Miller system of indices.

The rare earth nitride epitaxial layer 3 can be or comprise a fully (001) oriented epitaxial layer, that is, the (001) direction of the FCC structure of the REN layer 3 is perpendicular or substantially perpendicular to the surface of the hexagonal layer or substrate 5. The article *Temperature-Induced Four-Fold-on-Six-Fold Symmetric Heteroepitaxy, Rocksalt SmN on Hexagonal AlN* by Chan et al published in Cryst. Growth Des., 2016, 16 (11), pp 6454-6460, incorporated herein in its entirety by reference, provides details of how to produce such an epitaxial layer. Alternatively, the rare earth nitride epitaxial layer 3 can be or comprise a fully (111) oriented epitaxial layer, that is, the (111) direction of the FCC structure of the REN layer is perpendicular to the surface of the substrate.

(001) and (111) represents the crystallographic orientation as defined by Miller indices. A (111) orientation means that the crystal structure is made of, in a cross-sectional view, an atomic layer of the rare earth element then an atomic layer of nitrogen (N), then an atomic layer of RE and so on. A (001) orientation means that the crystal structure is made of, in a cross-sectional view, similar atomic layers with the same number of rare earth and N atoms that is repeated through the film.

The epitaxial interlayer 4, for example, preferably consists of or comprises between two and twelve monolayers, but is not limited to this number of monolayers.

The $Al_xGa_{1-x}N$ hexagonal crystal substrate 5 can be, for example, a bulk GaN substrate.

Figure 1B:
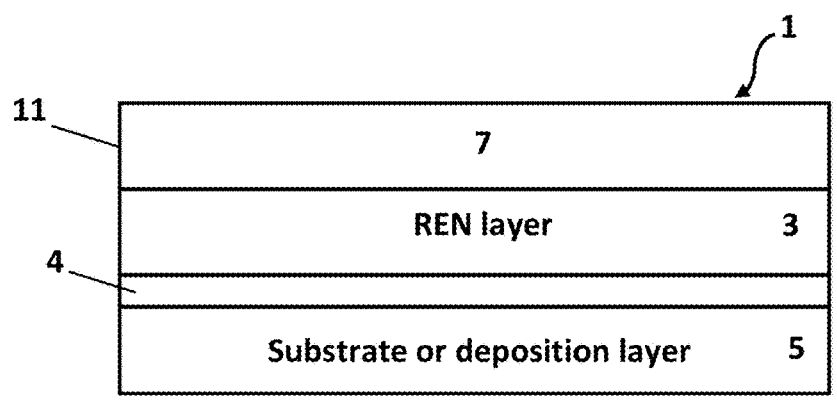
Figure 1C:
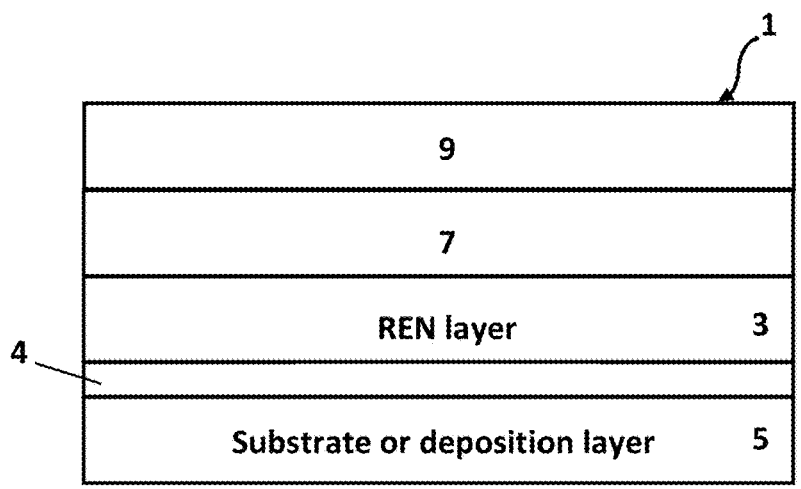

The $Al_xGa_{1-x}N$ hexagonal crystal layer 5 can be, for example, part of a template structure T (see, for example, FIG. 1E) comprising or consisting of an outer AlGaN or GaN layer 5 located or deposited on a substrate 5b. The outer AlGaN or GaN layer 5 may or may not be in direct contact with a substrate 5b. The AlGaN or GaN hexagonal crystal layer 5 can be the outer layer of a multilayer structure MS (see for example FIG. 1F) comprising or solely consisting of a plurality of group III-nitride epitaxial layers, this multilayer structure MS being in direct contact with the substrate 5b. For example, for a Si substrate 5, the multilayer structure MS may be AlN/GaN/AlN/GaN or AlN/GaN/AlN/AlGaN. For a $Al_2O_3$ substrate 5, the multilayer structure MS may be, for example, AlN/GaN or AlN/AlGaN. For a bulk GaN substrate 5, the multilayer structure MS may be, for example, AlGaN/GaN or GaN/AlGaN.

A non-limiting example of the substrate 5b is, for example, silicon, GaN, AlN, InN, or any alloys thereof, or $Al_2O_3$, or ZnO, or $Zn_xMg_{1-x}O$ with x ranging from 1 to 0.4.

The $Al_xGa_{1-x}N$ or $In_yGa_{1-y}N$ hexagonal crystal layer 5 can be an (0001)-oriented layer or the $Al_xGa_{1-x}N$ or $In_yGa_{1-y}N$ hexagonal crystal substrate 5 can be an (0001)-oriented hexagonal substrate.

Alternatively, the $Al_xGa_{1-x}N$ or $In_yGa_{1-y}N$ layer 5 may be a polycrystalline layer 5 deposited on a substrate that may, for example, be mono or polycrystalline or amorphous. The $Al_xGa_{1-x}N$ or $In_yGa_{1-y}N$ substrate 5 may be a mono or polycrystalline substrate 5. The at least one rare earth nitride layer 3 may be a polycrystalline rare earth nitride layer 3 and the interlayer 4 may be a polycrystalline layer.

The structure or device 1 may further include one or more epitaxial layers or non-epitaxial layers 7 (as for example illustrated in FIG. 1B), for example, polycrystalline layers that can be in direct contact with the rare earth nitride epitaxial layer 3.

The one or more epitaxial layers 7 can be a non-REN epitaxial layer or layers or a REN epitaxial layer or layers; or both non-REN epitaxial layer or layers and a REN epitaxial layer or layers, for example, forming multiple successive layers. The layer 7 may form a heterostructure, or a plurality of the layers 7 may form one or more heterostructures or superlattice. The layer or layers 7 can also be REN or non-REN polycrystalline layer or layers.

The structure or device 1 may further include one or more additional group III-nitride epitaxial or polycrystalline layers 9 (FIG. 1C) on the REN epitaxial or polycrystalline layer 7 or on the REN layer 3. The one or more group III-nitride layers 9 can be in direct contact with the rare earth nitride layer. The layer 9 may form a heterostructure, or a plurality of the layers 9 may form one or more heterostructures or superlattice.

The structure or device 1 may thus include layers or a region defining a superlattice, or one or multiple heterostructures. The superlattice or heterostructure may, for example, form an optical or electrical active region or device. The interlayer 4 and/or the $Al_xGa_{1-x}N$ or $In_yGa_{1-y}N$ layer 5 or substrate 5 may, for example, form or be part of an optical or electrical active region or device. The (epitaxial or polycrystalline) REN layer 3 and the layer or layers 7 may form a heterostructure, or a plurality of the layers 7 may form one or more heterostructures or superlattice. The (epitaxial or polycrystalline) REN layer 3 may form or be part of an optical or electrical active region or device, or the (epitaxial or polycrystalline) REN layer 3 and the layer or layers 7 may, for example, form or be part of an optical or electrical active region or device. The one or more group III-nitride (epitaxial or polycrystalline) layers 9 may, for example, form or be part of an optical or electrical active region or device.

For example, the structure or device 1 can be a spin-light emitting diode (LED), where the LED active part or region 9 can be, for example, GaN-based and the spin injection region can be made from the REN layer 3 or layers 3,7. The LED active part or region 9 (that may include one or more layers) is for example present on top of the spin injection region 3,7 or is in direct contact with the spin injection region 3, 7. Alternatively, the LED active part or region can be provided by the $Al_xGa_{1-x}N$ or $In_yGa_{1-y}N$ layer 5 (that can be a portion of the LED active part or region) and/or group III-nitride epitaxial layers located on for example a GaN substrate 5 or substrate 5b. The LED active part or region can be provided by group III-nitride epitaxial layers between the $Al_xGa_{1-x}N$ or $In_yGa_{1-y}N$ layer 5 and substrate 5b.

Figure 1D:
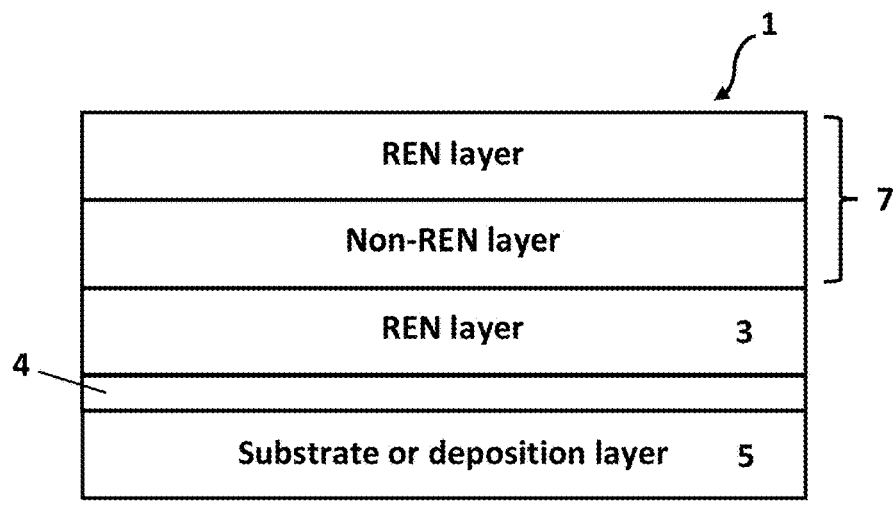

As shown for example in FIG. 1D, the structure or device 1 can include, for example, a trilayer superlattice comprising or consisting of a REN material or layer(s)/a non-REN material or layer(s)/a REN material or layer(s). Such a trilayer superlattice forms, for example, a Josephson junction or magnetic tunnel junction. The REN layer 3 is not necessarily part of this trilayer superlattice and this trilayer superlattice may include a different REN layer or material located on the REN layer 3 and that forms the trilayer superlattice. The trilayer superlattice may alternatively be formed by three REN layers.

The structure or device 1 may include a capping 11 for passivating the rare earth nitride epitaxial layer 3 (for example, the layer 7 of FIG. 1B is a passivating capping) or an outer rare earth nitride epitaxial layer located upon the rare earth nitride epitaxial layer 3. The capping 11 can be a capping layer deposited on the rare earth nitride material.

The capping 11 can, for example, be or include W, Cr, Cu, TaN, NbN or insulator films such as yttria stabilized zirconia (YSZ), or GaN, AlN or MgF.

The capping 11 can be a removable capping, for example, removable by evaporation or sublimation under a vacuum, including an ultra-high vacuum.

The removable passivating capping layer 11 includes or consists solely of: samarium, europium, thulium, magnesium, indium, antimony, bismuth, zinc, arsenic, silver, strontium, cadmium, calcium, lead, sodium, or tellurium.

The capping 11 may be epitaxial with doped or un-doped rare earth nitride material. The capping 11 may be polycrystalline, or amorphous with doped or un-doped rare earth nitride material.

The capping or capping layer thickness is preferably between about 1 to 200 nm, for example, between 120 to 150 nm or about 40 to 50 nm. It is preferably as thin as possible but thicknesses greater than 200 nm will also technically work.

The REN material (epitaxial or polycrystalline) layer 3 or any other REN material or layer included in the structure or device 1 can include or solely consist of a rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN). In other words, the REN material epitaxial layer 3 can include or solely consist of lanthanum nitride (LaN), or cerium nitride (CeN), or praseodymium nitride (PrN), or neodymium nitride (NdN), or samarium nitride (SmN), or europium nitride (EuN), or gadolinium nitride (GdN), or terbium nitride (TbN), or dysprosium nitride (DyN), or holmium nitride (HoN), or erbium nitride (ErN), or thulium nitride (TmN), or ytterbium nitride (YbN), or lutetium nitride (LuN), or any combination of the previously mentioned RENs. The REN material epitaxial layer 3 or any other REN material or layer included in the structure or device 1 can include or solely consist of an individual rare earth nitride of the above group.

The REN material layer 3 can preferably include or solely consist of neodymium nitride (NdN), or samarium nitride (SmN), or gadolinium nitride (GdN), or terbium nitride (TbN), or dysprosium nitride (DyN), or holmium nitride (HoN), or erbium nitride (ErN), or thulium nitride (TmN) directly in deposited on the intermediate layer 4. The REN material layer 3 may alternatively preferably include or solely consist of a rare earth nitride alloy of any two or more of these rare earth nitrides.

The REN material (epitaxial or polycrystalline) layer 3 or any other REN material or layer included in the structure or device 1 can additionally include a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN). The REN material epitaxial layer 3 or any other REN material or layer included in the structure or device 1 can additionally include an individual rare earth nitride alloy of any two or more of the above group.

The REN material epitaxial layer 3 or any other REN material or layer included in the structure or device 1 can alternatively include or solely consist of a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN). The REN material epitaxial layer 3 or any other REN material or layer included in the structure or device 1 can alternatively include or solely consist of an individual rare earth nitride alloy of any two or more of the above group.

The rare earth nitride material can be non-doped or doped with chemical elements from column/group II of the periodic table including beryllium, magnesium, calcium, strontium, barium and radium.

The rare earth nitride material can for example be made of one or more successive layers of rare earth nitride layers or alloys.

The rare earth nitride material or the doped-rare earth nitride material is a thin film. The film thickness is typically about 1 to 2000 nm.

Figure 1E:
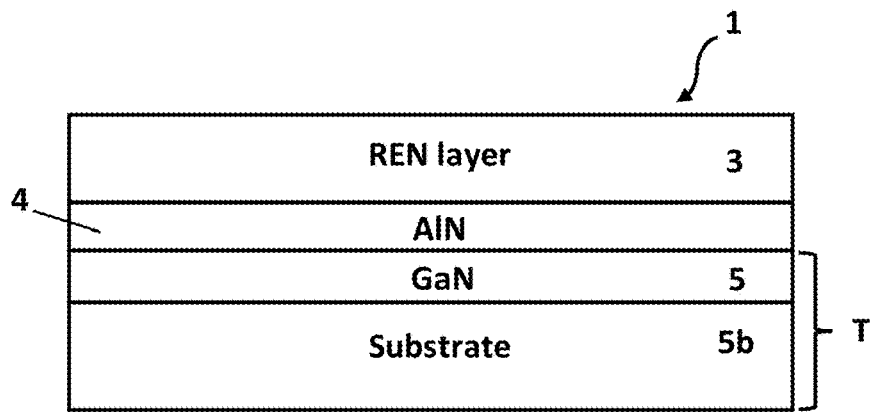
Figure 1F:
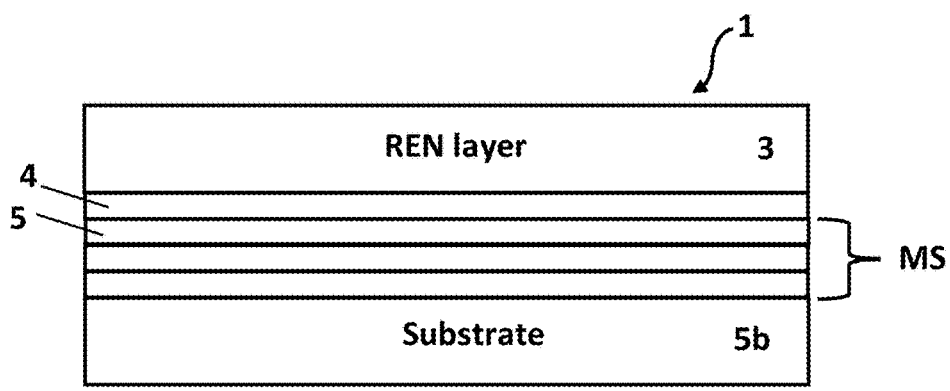

FIG. 1E schematically shows one non-limiting exemplary structure or device 1. In the specific example of FIG. 1E, the rare earth nitride material 3 is SmN and the interlayer 4 is AlN. This structure or device 1 further includes the template T comprising a substrate 5b that is a (111) silicon substrate and hexagonal (0001)-oriented GaN layer 5 (for example, 1.5 μm thick n-type (Si doped at $3\times10^{18}$ $cm^{-3}$, Ga-polar) on the silicon substrate. The template T may, for example, include or consist solely of the following layers located between the (111) silicon substrate and the GaN layer 5 and deposited on the (111) silicon substrate AlN (40 nm)/GaN (250 nm)/AlN (250 nm), the GaN layer 5 being deposited on the exemplary upper AlN 250 nm layer. These layers provide a high quality GaN layer 5 grown on a (111) silicon substrate as disclosed in the article published in Journal of Crystal Growth 311 (2009) pages 3278 to 3284 by A Le Louarn, S. Vézian, F. Semond, and J. Massies, incorporated herein in its entirety by reference. The present invention is not however limited to this template structure T which is an exemplary structure for providing for example a group III-nitride layer 5, for example, GaN. The AlN epitaxial interlayer 4 is located between and in direct contact with the SmN rare earth nitride material 3 and GaN layer 5 of the template T.

As previously mentioned, the template T can be replaced by a sole substrate or layer and the epitaxial interlayer 4 is thus alternatively located on or deposited on the sole substrate or layer and in direct contact with this sole substrate or layer.

It should be understood that the above examples are non-limiting examples and that the present invention concerns any structure or device 1 comprising or consisting of the rare earth nitride material 3 deposited on a $Al_zGa_{1-z}N$ epitaxial interlayer 4 with or without a capping layer deposited or formed thereon.

Another aspect of the present disclosure concerns a method for producing a rare earth nitride and group III-nitride structure 1 or device 1. The method includes the steps of providing a $Al_xGa_{1-x}N$ or $In_yGa_{1-y}N$ layer 5 or substrate 5 where for example $0 \leq x < 0.7$ and $0 < y \leq 1$, depositing an $Al_zGa_{1-z}N$ layer 4 directly on the layer or substrate 5 where for example $1 \geq z \geq 0.8$, and depositing at least one rare earth nitride layer 3 on the interlayer 4.

For example, the method includes the steps of providing a $Al_xGa_{1-x}N$ or $In_yGa_{1-y}N$ hexagonal crystal layer 5 or $Al_xGa_{1-x}N$ or $In_yGa_{1-y}N$ hexagonal crystal substrate 5, depositing an $Al_zGa_{1-z}N$ epitaxial layer 4 directly on the hexagonal crystal layer 5 or the hexagonal crystal substrate 5, and depositing at least one rare earth nitride epitaxial layer 3 on the epitaxial interlayer 4. Alternatively, the method includes the steps of providing a $Al_xGa_{1-x}N$ or $In_yGa_{1-y}N$ polycrystalline layer 5 or polycrystalline substrate 5, depositing an $Al_zGa_{1-z}N$ polycrystalline interlayer 4 directly on the $Al_xGa_{1-x}N$ or $In_yGa_{1-y}N$ polycrystalline layer 5 or polycrystalline substrate 5, and depositing at least one rare earth nitride polycrystalline layer 3 on the polycrystalline interlayer 4.

The structure or device 1 can be, for example, grown under vacuum in the production chamber of a molecular beam epitaxy system equipped with evaporation cells for rare earths and group III elements (for example, Al, Ga, In) as well as an ammonia gas nitrogen precursor and/or a pure nitrogen ($N_2$) precursor for providing the nitrogen for reaction with the rare earth element and Al, In or Ga for growing an $Al_xGa_{1-x}N$ or $In_yGa_{1-y}N$ layer 5, the epitaxial interlayer 4 and the rare earth nitride epitaxial layer 3 on the $Al_xGa_{1-x}N$ or $In_yGa_{1-y}N$ layer or substrate 5.

To demonstrate group III element segregation at the surface during growth of the REN on the group III-nitride surface and the deteriorated structural quality of the grown REN layer, structures were grown, for example, in a Riber molecular beam epitaxy (MBE) system equipped with a reflection high-energy electron diffraction (RHEED) gun (STAIB instruments 25 kV). Al, Ga and Sm are provided by conventional solid sources. Molecules of ammonia ($NH_3$) and pure nitrogen ($N_2$) were used as nitrogen precursor for the growth of GaN/AlN and SmN, respectively. Exemplary structures were grown on 1.5 m thick n-type (Si doping at $3\times10^{18}$ $cm^{-3}$) Ga-polar GaN(0001). This GaN layer was the outer layer of a template structure consisting of a (111) silicon substrate/AlN (40 nm)/GaN (250 nm)/AlN (250 nm). The SmN layers were grown at a substrate temperature of 400° C. under N-rich conditions, with a beam equivalent pressure (BEP) of $2.7\times10^{-5}$ Torr and $5\times10^{-8}$ Torr for $N_2$ and Sm respectively, corresponding to a growth rate of 0.1 μm/h (inferred from ex-situ thickness measurements via cross-section scanning electron microscopy on a freshly cleaved edge of ~150 nm samples).

In situ scanning tunneling microscopy (STM) and X-ray photoelectron spectroscopy (XPS) measurements were performed at room temperature. XPS was carried out using a Mg Kα (hv=1253.6 eV) non-monochromated X-ray source, equipped with a 7 channel hemispherical analyzer, using a pass energy of 10 eV. All measurements were taken at the normal incidence of the sample. For the X-ray diffraction (XRD) measurements, 100 nm thick SmN layers were capped with GaN (thickness of 100-150 nm) in order to prevent decomposition in air.

Figure 2A:
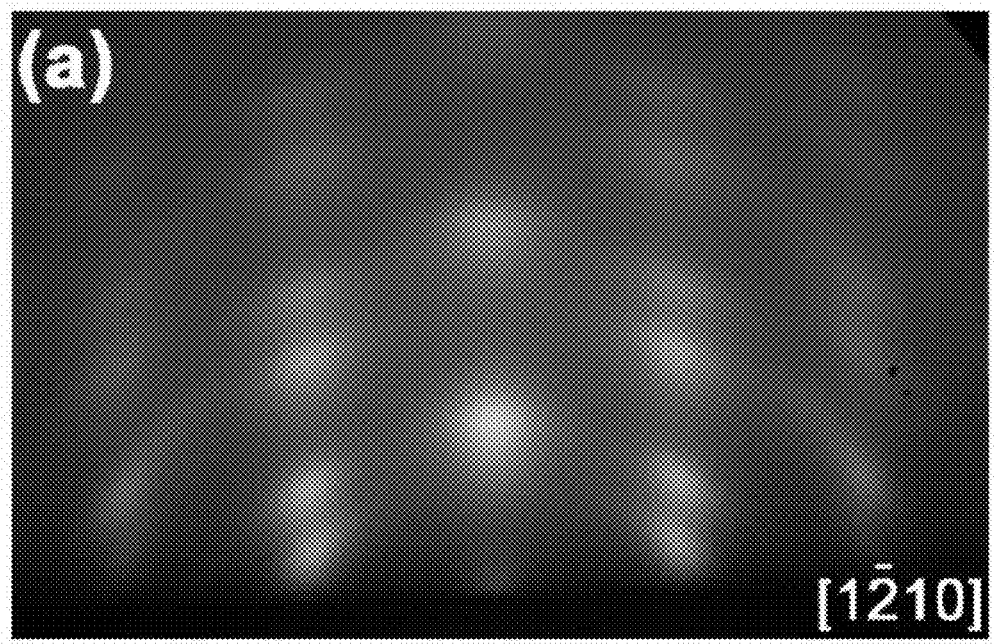
FIG. 2A shows a RHEED pattern recorded along the [1-210] azimuth of GaN(0001) after the growth of 2 nm of SmN on GaN.

Prior to the SmN growth, the in situ RHEED pattern shows the typical 2×2 surface reconstruction of Ga-polar GaN (0001) at low temperature (below 550° C.). When the growth of SmN directly on GaN starts, the diffraction pattern changes drastically from sharp streaks to a weak and diffuse background. After a few monolayers (about 4-5 MLs, 1 ML=0.29 nm), some circles appear which are characteristic of the diffraction by polycrystalline film (FIG. 2A).

Figure 2B:
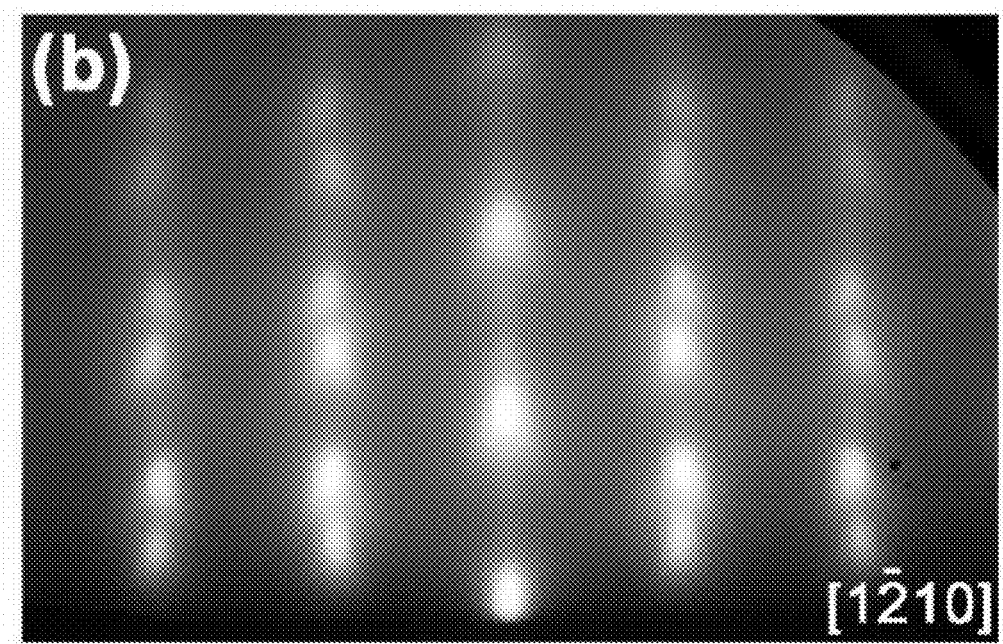
FIG. 2B shows a RHEED pattern recorded along the [1-210] azimuth of GaN(0001) after the growth of 15 nm of SmN on GaN.
Figure 2C:
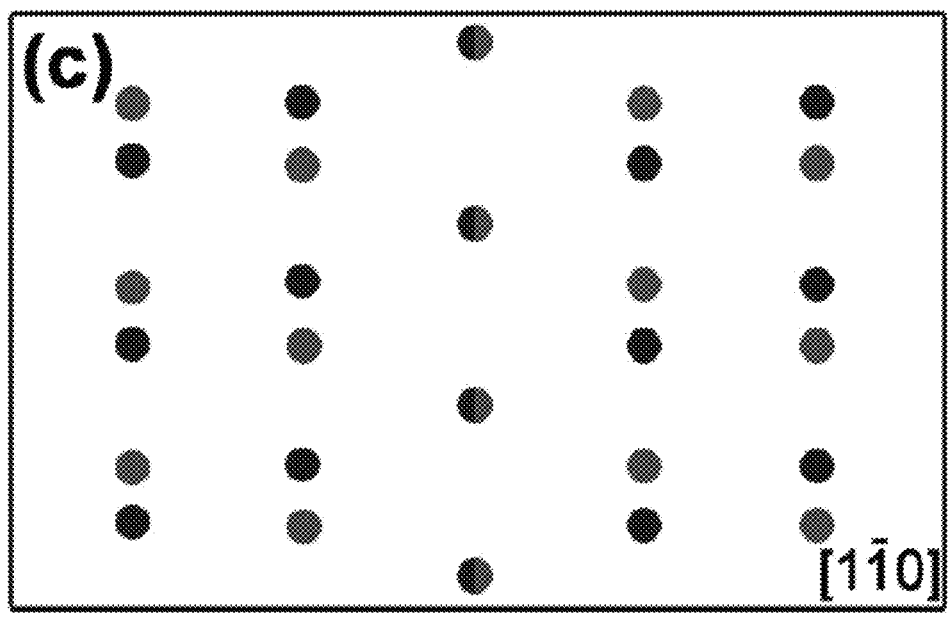
FIG. 2C represents a geometrical arrangement of diffraction spots along the (1-10) direction for a fcc single crystal (darker circles) with a second fcc crystal rotated by 180° (lighter circles) corresponding to twins domain being superimposed, the diffraction spots were generated using jems software (JEMS-SAAS Switzerland).

Then the pattern slowly evolves to a spotty diagram after the deposition of 10-15 nm of SmN (see FIG. 2B). The spotty pattern observed is similar to the one previously reported for GdN, with double spots, linked to twinned domains in the face-centred cubic (fcc) structure of REN, along the GaN [1-210] azimuth (FIG. 2C). In both cases (GdN, SmN), the orientation of the REN films is (111) as also verified here by XRD 2θ-ω scans (not shown).

Figure 3A:
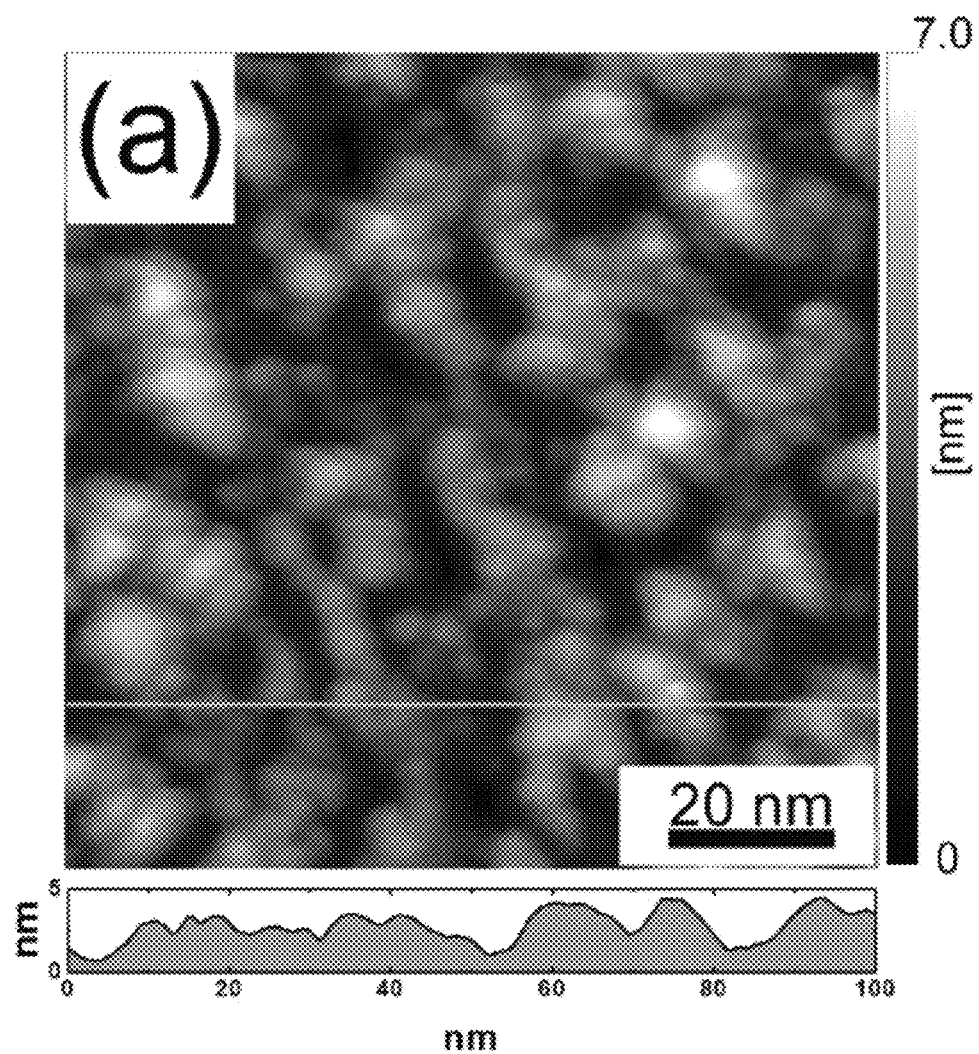
FIG. 3A shows a 100×100 $nm^2$ STM image of 13 nm thick SmN grown at 400° C. directly on GaN, where acquisition parameters are 0.35 nA and +2 V (empty states).

FIG. 3A shows an in situ STM image of about 13 nm thick SmN layers grown directly on GaN. The root mean square (rms) roughness is about 1 nm.

XPS chemical surface analysis was carried out. Several cycles of SmN deposition followed by in situ XPS measurements were carried out (FIG. 4). The SmN thickness (deduced from the growth time) ranges from 0 to about 13 nm. The Sm 4d, Ga 3p and N 1s core level spectra are recorded as a function of the SmN coverage. Regarding the Sm 4d peak (see FIG. 4A), its intensity increases when the SmN growth proceeds, as expected. This peak is structured by three contributions at 135.0 eV, 131.4 eV and 128.8 eV, respectively, typical of the RE series due to the $4d^9 4f^n$ interaction.

Figure 4A:
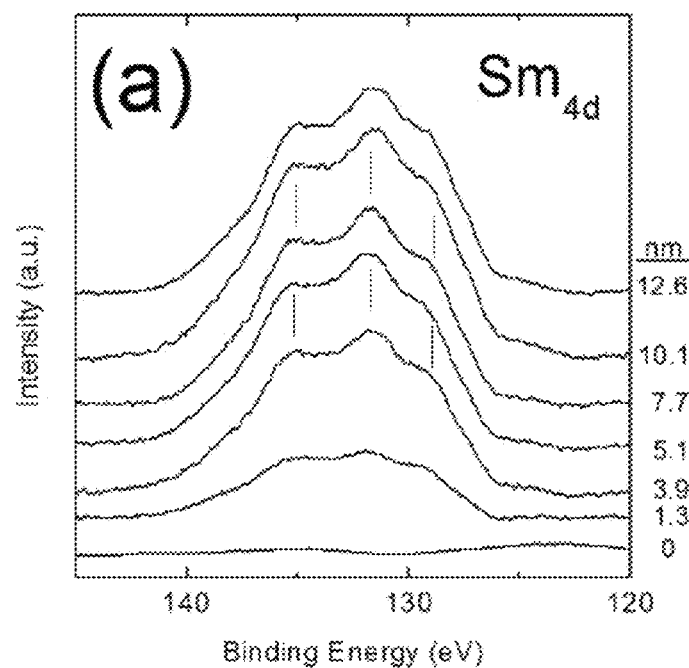
FIG. 4A shows XPS spectra taken at the Sm 4d core level region for a sample for which the SmN layer is directly grown on GaN.
Figure 4B:
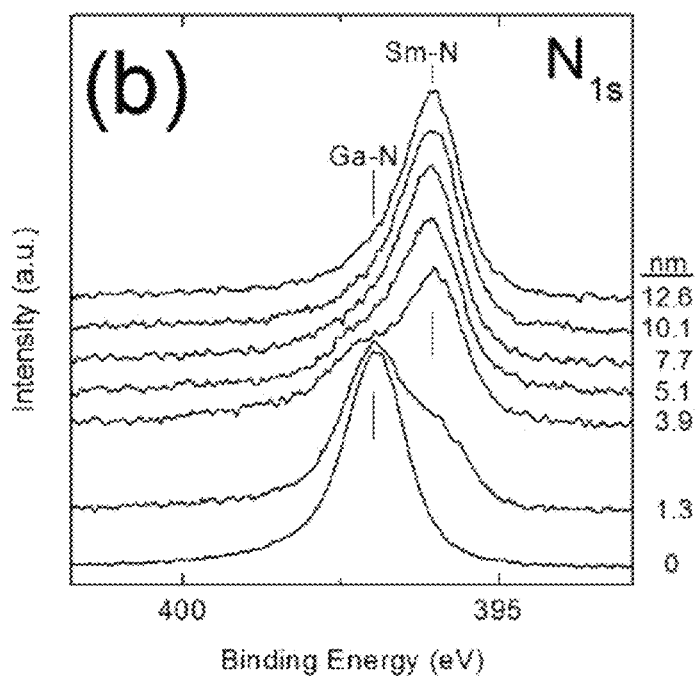
FIG. 4B shows XPS spectra taken at the N 1s core level region for a sample where the SmN layer is directly grown on GaN.

The energy position of the N 1s core level peak as a function of the SmN coverage was also measured. A shift in energy from 397.0 eV to 396.1 eV is observed when increasing the SmN coverage (FIG. 4B). This shift has a chemical origin and can be explained as follows. Before growing SmN, the N 1s component corresponds to that of the GaN layer, where each nitrogen atom is bonded to four gallium atoms. Once the growth of SmN proceeds, a second component is superimposed due to the change in the crystal structure, from wurtzite to rocksalt, where each nitrogen atom is now surrounded by six samarium atoms. Therefore, the observed shift is related to the change in the binding energy of the N 1s core level.

The behaviour of the Ga 3p spectrum as a function of the SmN coverage displayed in FIG. 4C, although not straightforward, may be understood as follows: the Ga 3p peak intensity decreases but does not disappear. The remaining presence of the Ga 3p peak, even for thick SmN layers, suggests either SmN islanding growth or Ga segregation at the SmN surface during growth. Interestingly, the Ga 3p peak (a doublet with 3p ½ and 3p ¾ components) is shifted during the growth of SmN from 107.7 eV and 104.3 eV (GaN starting surface) to 106.9 eV and 103.5 eV (after the growth of about 13 nm of SmN), while no significant energy shift is observed for the Sm 4d. Such a shift of about 0.8 eV towards low binding energy when increasing the SmN coverage suggests that Ga is no longer bound to nitrogen as in GaN. Thus, it is believed that the remaining presence of the Ga peak for thick SmN layers is not related to parts of the GaN surface not entirely covered by the SmN layer due to islanding growth, but rather indicates a Ga surface segregation phenomenon.

Figure 5A:
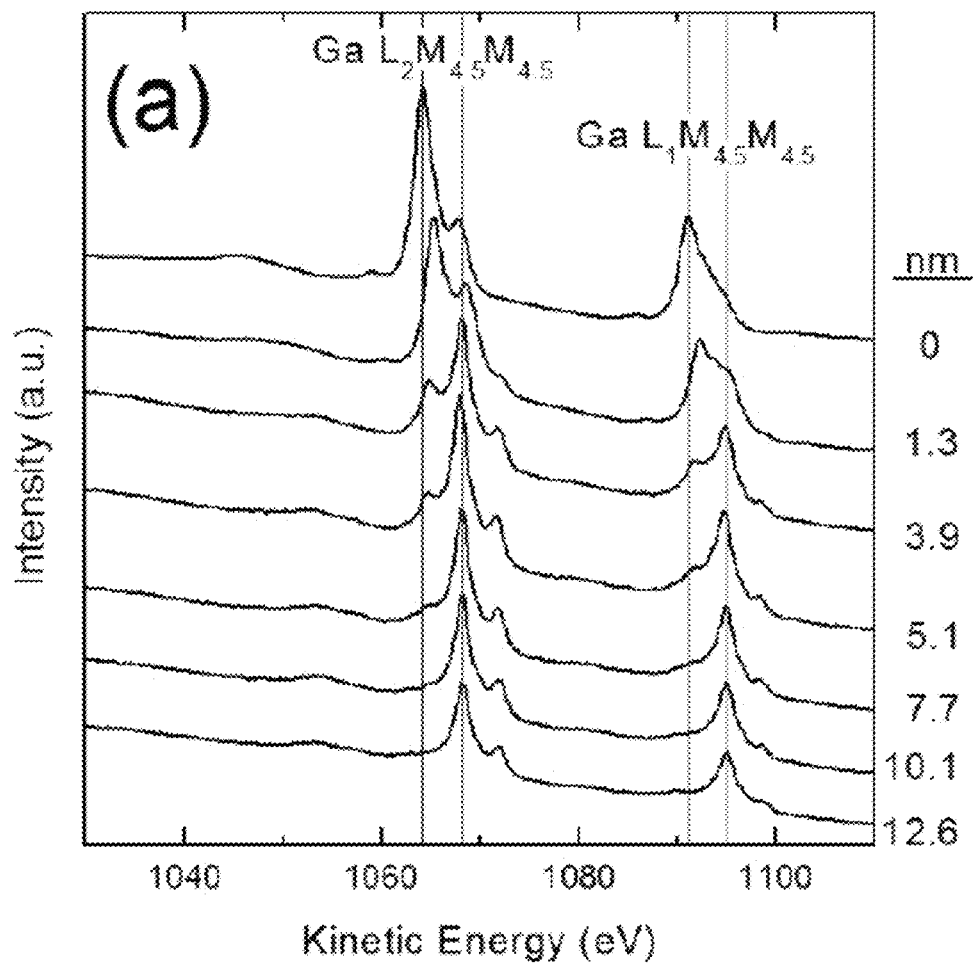
FIG. 5A shows XPS spectra taken at the Ga LMM Auger electron peaks region for a sample where the SmN layer is directly grown on GaN; the vertical lines are guides for the eye and indicate peak positions corresponding to metallic Ga and GaN, respectively.

This is well confirmed by considering the Ga LMM Auger transition spectrum evolution with SmN growth reported in FIG. 5A. When growing SmN directly on GaN, a second set of components is rapidly superimposed to the initial one coming from GaN, shifted from 4 eV to the high kinetic energy side, and becomes predominant after 3.9 nm growth. Such Auger line chemical shift of 4 eV has been reported for metallic gallium on GaN, confirming the above mentioned Ga segregation.

To go further, the integrated areas under the core level peaks reported in FIG. 4 were calculated. FIG. 6A shows the integrated intensity of Sm 4d peaks as a function of the SmN thickness (dark circles). In addition, the integrated intensity of Ga 3p peaks (dark circles) is reported as a function of the SmN thickness in FIG. 6B. Experimental curves are fitted using the Beer-Lambert relationship:

$$I = I_0 \exp(-d/\lambda) \quad (1)$$

where $I_0$ is the photoelectrons intensity emitted at a depth d below the surface, $\lambda$ is the attenuation length (AL) and I is the photoelectrons intensity reaching the surface. Considering a two dimensional (2D) surface layer of thickness d (SmN in our case), the intensity of electron emitted from the substrate (across the surface layer) is given by Eq. (1) where $I_0$ is the intensity without the surface layer. On the other hand, to obtain the expression for the signal coming from a thin SmN surface layer of thickness d, the Beer-Lambert equation must be integrated (between 0 and d) and becomes:

$$I = I^\infty [1 - \exp(-d/\lambda)] \quad (2)$$

where $I^\infty$ is the intensity from the "bulk" material (i.e. with d infinite).

Applying these equations to the measured data, AL values $\lambda$ of (11±4) nm for Ga 3p and (3.0±0.3) nm for Sm 4d are found. In the case of Sm 4d, 12.6 nm is taken for the value of $I^\infty$ (corresponding to 4λ, a reasonable approximation). It is noted that in the case of Ga 3p (FIG. 6B), the intensity attenuation is not significantly affected for SmN thickness in the range of 0-2 nm, probably due to 3D islands nucleation. However, it follows a 2D overlayer model for higher thickness, for which the roughness becomes negligible. If one neglects the elastic collisions in first approximation, the attenuation length (AL) and the inelastic mean free path (IMFP) can be used interchangeably. By using the method of Tanuma et al. to calculate the IMFP for Sm 4d peak (kinetic energy of 1122 eV), a value of 3.2 nm is found which is in good agreement with the AL extracted from FIG. 6A and validates the approximation of 2D surface layer, i.e. no islanding growth.

On the other hand, for the Ga 3p peak (kinetic energy of 1180 eV), IMFP of 3.3 nm is obtained, i.e. significantly lower than the AL (11 nm) determined experimentally. This is fully consistent with the presence of Ga at the surface. In turn, this would mean that GaN bond-breaking occurs in the very first stages of the SmN growth. It is worth mentioning that, even at room temperature, a chemical reaction takes place at the interface when Sm or Ni are deposited onto GaN. In both cases, it is concluded that Ga is released at the interface. In the present case, the growth of SmN being performed at 400° C., the reactivity at the surface should be enhanced. Owing to the strong reactivity of Sm towards nitrogen, an exchange reaction between Sm and Ga at the GaN surface can result. As Ga, contrary to Sm, does not react with molecular nitrogen (even at temperature far above 400° C.), "free" Ga is believed to be formed at the interface and is segregated during the subsequent SmN growth.

Such segregation is expected to be independent of crystal orientation and crystal structure (hexagonal wurtzite, cubic zinc blende). Segregation is expected to be independent of polarity and to be present in the case of for example N-polar GaN(0001). Both the wurtzite and zinc-blende structure are non-centrosymmetric crystals with polar axes. The wurtzite crystal for example is made from the stacking of group III elements and nitrogen bilayers in different sequences along the c axis. It is referred to the polarity of the layer, defined by the direction of the III-N bonds parallel to c-axis. A c plane GaN layer is called Ga face or Ga polar (or +c) when N atom is on top of Ga atom; in reverse, it is N-face or N-polar (or −c).

Advantageously, such an interfacial reaction is suppressed or does not occur if the REN layer 3 growth is performed directly on an interlayer 4, for example an AlN interlayer, instead of directly on the GaN surface of the GaN layer or substrate 5.

Where, for example, the goal is to grow a REN layer 3 with the best possible structural quality on GaN, a limited thickness of AlN is preferably deposited. AlN may preferably be elastically strained on GaN permitting to avoid or reduce the formation of dislocations. For example, the 2.4% lattice mismatch between AlN and GaN results in a critical thickness for plastic relaxation as thin as 12 monolayers (MLs), or about 3 nm.

For example, epitaxial layers are grown in the manner described previously. The first stages of SmN growth on an AlN interlayer directly on GaN show a behavior significantly different to the one corresponding to the SmN growth directly on bare GaN, and this from only 2 MLs of AlN (1 ML=0.25 nm). At the onset of the growth, the RHEED pattern does not disappear as in the case of growth on the bare GaN: the starting AlN diagram (streaky) coexists with a spotty one, located at lower spacing distance which corresponds to a larger lattice parameter as expected for a SmN (111) surface (a=3.56 Å for SmN, compared to 3.19 Å for GaN and pseudomorphic AlN). This indicates a sharp interface formation. In addition, we do not observe the formation of circle arcs characteristic of a polycrystalline phase. After the growth of typically 3 to 4 MLs, only the spotty pattern related to the SmN layer remains. This pattern is almost identical to the one obtained after the deposition of 15 nm of SmN grown directly on bare GaN shown in FIG. 2B.

Figure 3B:
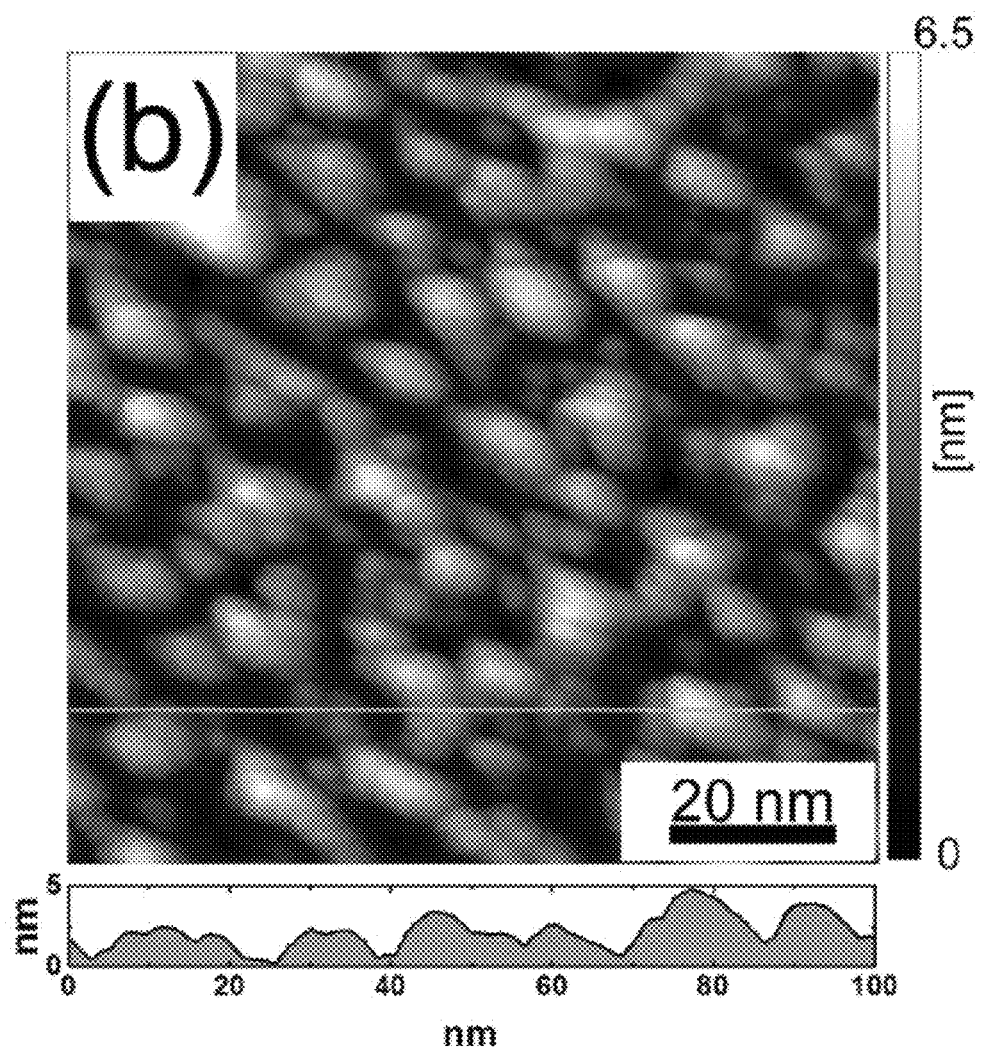
FIG. 3B shows a 100×100 $nm^2$ STM image of 13 nm thick SmN grown at 400° C. on a 8 monolayer (ML) thick AlN interlayer grown on GaN, where acquisition parameters are 0.35 nA and +2 V (empty states).

An in situ STM image of a 13 nm thick SmN layer grown on AlN surface (FIG. 3B) shows that the surface roughness is similar to the one obtained for SmN grown directly on GaN (rms of ~1 nm).

Integrated area under core level peaks versus the SmN thickness for Sm 4d and Al 2p peaks deduced from XPS measurements on SmN grown on 8 ML AlN interlayer on GaN are shown in FIG. 6 (white circles). The Sm 4d data agree well with the one obtained for SmN growth directly on bare GaN, indicating that the growth rate of SmN is the same for the two different experiments (FIG. 6A).

Figure 4C:
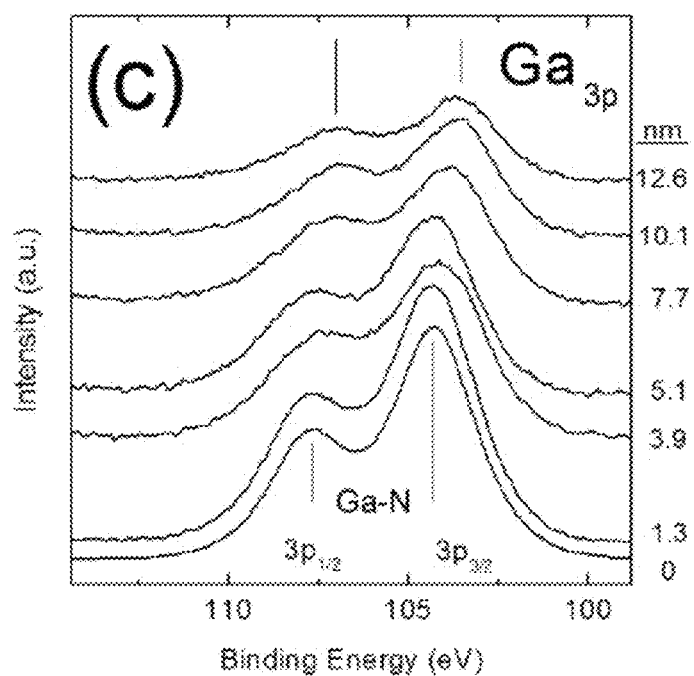
FIG. 4C shows XPS spectra taken at the Ga 3p core level region for a sample where the SmN layer is directly grown on GaN.
Figure 4D:
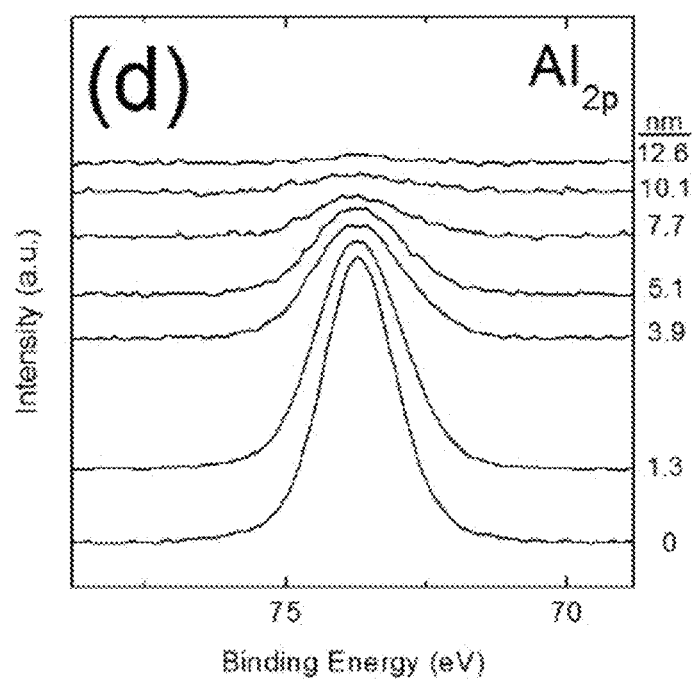
FIG. 4D shows XPS spectra taken at the Al 2p core level region for a sample where the SmN layer is grown on 8 ML thick AlN interlayer grown on GaN.

Considering now the Al 2p peak (kinetic energy of 1150 eV) coming from the underlying AlN, no shift is observed when the SmN growth proceeds (FIG. 4D), contrary to the behavior observed for the Ga 3p peak during the SmN growth on GaN (FIG. 4C). In addition, an experimental AL of (3.6±0.5) nm is deduced from its intensity attenuation by the SmN layer (FIG. 6B), in agreement with calculated IMFP of 3.24 nm. Also, the Ga signal from the underlying GaN layer rapidly decays.

Figure 5B:
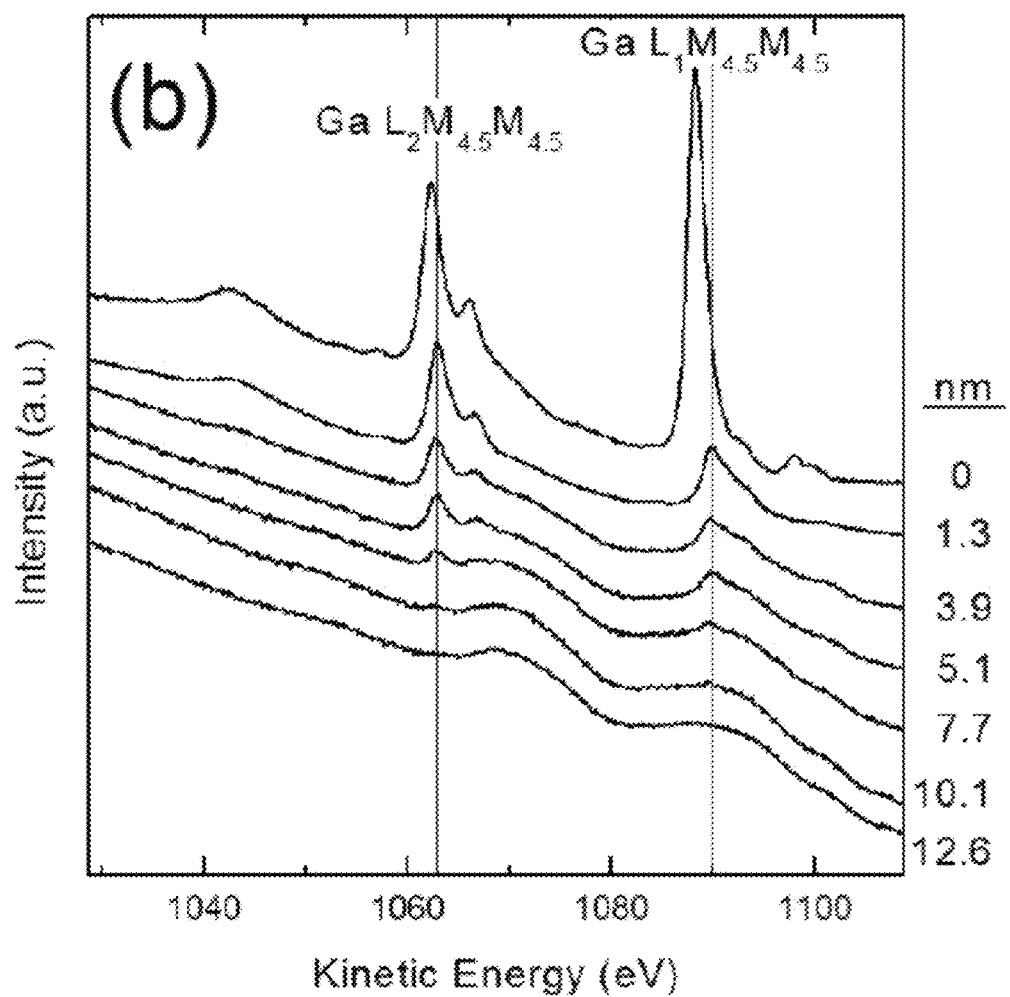
FIG. 5B shows XPS spectra taken at the Ga LMM Auger electron peaks region for a sample where the SmN layer is grown on a 8 ML thick AlN interlayer grown on GaN; the vertical lines are guides for the eye and indicate peak positions corresponding to metallic Ga and GaN, respectively.

As shown in FIG. 5B, the Ga LMM Auger transitions are no longer observed after the growth of ~10 nm of SmN, as expected. Furthermore, there is no shift of the Ga Auger lines during the growth of SmN. These results evidence that the Ga segregation is suppressed when an AlN interlayer 4 is used.

Therefore, when growing the REN layer 3 on an AlN surface there is no evidence of surface segregation or interfacial reaction between the rare earth and the AlN surface. This can explain the difference of the RHEED pattern evolution during the very first stages of the growth of SmN on GaN and AlN surfaces: the odd behavior observed on the bare GaN surface is related to the reaction of the rare earth on GaN leading to a diluted and complex interface.

The presence of two components in the N 1s peak (not shown) was also observed, similar to what is reported above for growth directly on bare GaN surface. This peak shifts to lower binding energy during SmN deposition from 397.7 eV to 396.1 eV. Thus, chemical shifts of 0.9 eV and 1.6 eV are observed during the growth of SmN on GaN and on AlN, respectively. Even though the energy shift of the core levels measured by XPS also integrate final state effects phenomena like intra-atomic trapping or surface relaxation, it has been shown that initial state effects (chemical bonding) are often the dominant factors. Indeed, the N is energy shift of 0.7 eV observed between GaN and AlN agrees well with the difference in the cohesive energy per bond of GaN and AlN which is 2.20 eV and 2.88 eV, respectively.

An estimate of the cohesive energy per bond in SmN of (1.3±0.1) eV is therefore found by subtracting the N 1s chemical shift to the cohesive energy for both type of structures. This result is consistent with first principles calculation performed on some REN, and in particular for GdN: a cohesive energy per bond of about 1 eV is deduced from the cohesive energy per atom value (5.9 eV). It is noted that, to the best of our knowledge, no cohesive energy value for SmN has ever been reported.

From RHEED, XPS as well as STM experiments reported above, one expects some difference in the structural properties of SmN depending on the starting growth surface. Therefore, X-ray diffraction on 100 nm thick SmN layers directly grown on GaN and on an AlN interlayer inserted before the SmN growth have been performed. The thickness of the AlN interlayer has been varied from 2 ML to 20 ML. The rocking curve (ω-scan) of the SmN (111) diffraction peak has been recorded and its full width at half-maximum (FWHM) is shown in FIG. 7. The FWHM decreases of about an order of magnitude when the AlN interlayer increases up to 8 ML and then slowly increases. The latter is probably related to the plastic relaxation of AlN on GaN when the AlN thickness exceeds ~12 ML, resulting in the formation of dislocations impacting the crystalline quality of the SmN overlayer. One key result is, however, the strong FWHM decrease observed even for an AlN interlayer of only 2 ML. As AlN has the same structure as GaN and is elastically strained, i.e. has the same in-plane parameter, the reason for the improvement of the SmN epitaxial layer structural quality is due to the suppression of the interface reaction at the REN/GaN interface and the resulting Ga surface segregation.

The first stages of the epitaxial growth of a REN on GaN was thus analysed by RHEED, XPS and STM. RHEED indicates the formation of a diluted and complex REN/GaN interface. In turn, XPS spectra recorded as a function of the REN growth show that Ga segregates at the surface of the growing layer. This problem is solved through the insertion of AlN (for example, a few monolayers) at the REN/GaN interface to provide a sharp interface as indicated by RHEED measurements.

A specific reaction occurs between the REN atoms and the GaN surface: in the above presented case, Sm—N bonds are formed to the detriment of Ga—N ones, resulting in the release of Ga which segregates at the surface of the REN growing layer. The FWHM of X-ray diffraction rocking curve is significantly improved by the presence of an AlN interlayer 4 at the REN/GaN interface, clearly demonstrating the key role of the interface chemistry on the structural quality of REN epitaxial layers on GaN.

Based on the above, segregation is equally anticipated for deposition of a REN not only on a GaN surface but also on an $Al_xGa_{1-x}N$ surface where $0<x<0.7$. Segregation is also anticipated for deposition of a REN on an InN surface given that the cohesive energy of InN is less than GaN as well as on a $In_yGa_{1-y}N$ layer surface where $0<y\leq1$.

It is also scientifically deduced from the above results and analysis that while a AlN interlayer will permit segregation to be removed or significantly reduced, an $Al_zGa_{1-z}N$ interlayer with a high Al composition where $1>z\geq0.8$ should equally provide the same result.

This segregation is equally expected for polycrystalline or amorphous layers with the inclusion of for example an AlN polycrystalline or amorphous layer also expected to provide the solution to this segregation. REN polycrystalline layers can be obtained when the REN layers are grown at room temperature, or at sufficient low growth temperature, typically below 400° C. GaN and AlN polycrystalline or amorphous layers can be obtained when deposited on a polycrystalline or amorphous substrate or layer, or at sufficient low temperature, typically below 500° C. on a monocrystalline substrate or layer.

According to an aspect of the present disclosure, the composition of the $Al_xGa_{1-x}N$ layer or substrate 5 may be, for example, $0 \leq x < 0.8$, or $0 \leq x < 0.6$, or $0 \leq x < 0.5$, or $0 \leq x < 0.4$, or $0 \leq x < 0.3$, or $0 \leq x < 0.2$, or $0 \leq x < 0.1$. The composition of the $Al_zGa_{1-z}N$ interlayer 4 may be for example, $1 > z \geq 0.9$, or $1 > z \geq 0.95$.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A device comprising:
   an $Al_xGa_{1-x}N$ or $In_yGa_{1-y}N$ layer or substrate where $0 \leq x < 0.7$ and $0 < y \leq 1$,
   at least one rare earth nitride layer, and
   an $Al_zGa_{1-z}N$ interlayer between the at least one rare earth nitride layer and the $Al_xGa_{1-x}N$ or $In_yGa_{1-y}N$ layer or substrate where $1 \geq z \geq 0.8$, wherein the $Al_zGa_{1-z}N$ interlayer is in direct contact with the at least one rare earth nitride layer and the $Al_xGa_{1-x}N$ or $In_yGa_{1-y}N$ layer or substrate,
   wherein the $Al_xGa_{1-x}N$ or $In_yGa_{1-y}N$ layer is a hexagonal crystal layer or the $Al_xGa_{1-x}N$ or $In_yGa_{1-y}N$ substrate is a hexagonal crystal substrate, the at least one rare earth nitride layer is a rare earth nitride epitaxial crystal layer and the $Al_zGa_{1-z}N$ interlayer is an $Al_zGa_{1-z}N$ epitaxial crystal layer, and
   wherein the hexagonal crystal layer or hexagonal crystal substrate has a hexagonal net with a six-fold symmetry.

2. The device according to claim 1, wherein the hexagonal crystal layer or hexagonal crystal substrate has a hexagonal wurtzite structure.

3. The device according to claim 1, wherein the rare earth nitride epitaxial layer comprises a fully (001) oriented epitaxial layer.

4. The device according to claim 1, wherein the rare earth nitride epitaxial layer comprises a fully (111) oriented epitaxial layer.

5. The device according to claim 1, wherein the $Al_zGa_{1-z}N$ epitaxial interlayer consists of or comprises between two and twelve monolayers.

6. The device according to claim 1, further including a capping for passivating the rare earth nitride epitaxial layer.

7. The device according to claim 1, wherein the rare earth nitride epitaxial layer includes or consists of at least one rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

8. The device according to claim 1, wherein the rare earth nitride epitaxial layer includes or consists of at least one rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

9. The device according to claim 1, wherein the rare earth nitride epitaxial layer is doped with at least one element that is beryllium, magnesium, calcium, strontium, barium or radium.

10. The device according to claim 1, further including at least one additional rare earth nitride epitaxial layer or multiple successive rare earth nitride epitaxial layers, the at least one additional rare earth nitride epitaxial layer or multiple successive rare earth nitride epitaxial layers comprising or consisting of a rare earth nitride and/or an alloy of rare earth nitrides.

11. The device according to claim 1, further including an additional optical active layer or region located on the rare earth nitride epitaxial layer, or an additional electrical active layer or region located on the rare earth nitride epitaxial layer.

12. The device according to claim 11, wherein the additional optical active layer or region located on the rare earth nitride epitaxial layer, or the additional electrical active layer or region is a Group III-nitride layer or region.

13. The device according to claim 1, wherein the hexagonal crystal layer is a (0001)-oriented layer or the hexagonal crystal substrate is a (0001)-oriented hexagonal substrate.

14. The device according to claim 1, wherein the $Al_xGa_{1-x}N$ or $In_yGa_{1-y}N$ crystal layer is located on one of the following materials: GaN, AlN, InN, or any alloys thereof, or $Al_2O_3$, or ZnO, or $Zn_xMg_{1-x}O$ with x ranging from 1 to 0.4.

15. The device according to claim 1, wherein the rare earth nitride epitaxial layer is SmN.

16. The device according to claim 1, wherein the $Al_xGa_{1-x}N$ layer or the $Al_xGa_{1-x}N$ substrate comprises GaN and the $Al_zGa_{1-z}N$ interlayer comprises AlN.

17. The device according to claim 1, wherein the $Al_xGa_{1-x}N$ or $In_yGa_{1-y}N$ layer is a polycrystalline layer or the $Al_xGa_{1-x}N$ or $In_yGa_{1-y}N$ substrate is a polycrystalline substrate, the at least one rare earth nitride layer is a polycrystalline rare earth nitride layer and the $Al_zGa_{1-z}N$ interlayer is a polycrystalline layer.

18. A device comprising:
   an $Al_xGa_{1-x}N$ or $In_yGa_{1-y}N$ layer or substrate where $0 \leq x < 0.7$ and $0 < y \leq 1$;
   at least one rare earth nitride layer; and
   an $Al_zGa_{1-z}N$ interlayer between the at least one rare earth nitride layer and the $Al_xGa_{1-x}N$ or $In_yGa_{1-y}N$ layer or substrate where $1 \geq z \geq 0.8$,
   wherein the $Al_zGa_{1-z}N$ interlayer is in direct contact with the at least one rare earth nitride layer and the $Al_xGa_{1-x}N$ or $In_yGa_{1-y}N$ layer or substrate, and
   wherein the $Al_zGa_{1-z}N$ interlayer consists of or comprises between two and twelve monolayers.

19. The device comprising:
   an $Al_xGa_{1-x}N$ or $In_yGa_{1-y}N$ layer or substrate where $0 \leq x < 0.7$ and $0 < y \leq 1$;
   at least one rare earth nitride layer; and
   an $Al_zGa_{1-z}N$ interlayer between the at least one rare earth nitride layer and the $Al_xGa_{1-x}N$ or $In_yGa_{1-y}N$ layer or substrate where $1 \geq z \geq 0.8$,
   wherein the $Al_zGa_{1-z}N$ interlayer is in direct contact with the at least one rare earth nitride layer and the $Al_xGa_{1-x}N$ or $In_yGa_{1-y}N$ layer or substrate, and wherein the $Al_xGa_{1-x}N$ or $In_yGa_{1-y}N$ layer is a polycrystalline layer or the $Al_xGa_{1-x}N$ or $In_yGa_{1-y}N$ substrate is a polycrystalline substrate, the at least one rare earth nitride layer is a polycrystalline rare earth nitride layer and the $Al_zGa_{1-z}N$ interlayer is a polycrystalline layer.

* * * * *

UNITED STATES PATENT AND TRADEMARK OFFICE
CERTIFICATE OF CORRECTION

PATENT NO. : 10,043,871 B1
APPLICATION NO. : 15/480406
DATED : August 7, 2018
INVENTOR(S) : Franck Natali and Stephane Ange Vezian It is certified that error appears in the above-identified patent and that said Letters Patent is hereby corrected as shown below:

On the Title Page

Item (73), left column, Lines 7-9 please delete:
"(73) Assignee: ECOLE POLYTECHNIQUE FEDERALE DE LAUSANNE (EPFL), Lausanne (CH)"

Signed and Sealed this
Ninth Day of July, 2019

Andrei Iancu
*Director of the United States Patent and Trademark Office*